United States Patent [19]

Fushimi et al.

[11] Patent Number: 4,807,009
[45] Date of Patent: Feb. 21, 1989

[54] LATERAL TRANSISTOR

[75] Inventors: Ikuo Fushimi, Ebina; Takamasa Sakuragi, Hiratsuka, both of Japan

[73] Assignee: Canon Kabushiki Kaisha, Tokyo, Japan

[21] Appl. No.: 219,857

[22] Filed: Jul. 13, 1988

Related U.S. Application Data

[63] Continuation of Ser. No. 47,519, May 6, 1987, abandoned, which is a continuation of Ser. No. 827,152, Feb. 7, 1986, abandoned.

[30] Foreign Application Priority Data

Feb. 12, 1985 [JP] Japan .................................. 60-023653

[51] Int. Cl.[4] ...................... H01L 29/78; H01L 29/72; H03K 17/60
[52] U.S. Cl. .................................. 357/35; 357/23.13; 357/36; 357/86; 307/255
[58] Field of Search ................... 357/23.13, 36, 35, 86; 307/255

[56] References Cited

U.S. PATENT DOCUMENTS

| 3,676,714 | 7/1972 | Wensink et al. | 357/86 |
| 3,878,551 | 4/1975 | Callahan, Jr. | 357/86 |
| 4,044,373 | 8/1977 | Nomiya et al. | 357/23.13 |
| 4,345,166 | 8/1982 | Allen et al. | 357/36 |
| 4,350,904 | 9/1982 | Cordell | 307/255 |

Primary Examiner—Martin H. Edlow
Assistant Examiner—Gregory A. Key
Attorney, Agent, or Firm—Fitzpatrick, Cella, Harper & Scinto

[57] ABSTRACT

In a lateral transistor having a first semiconductor region of one conductivity type, and an emitter region and a collector region both having the opposite conductivity type and disposed in the first semiconductor region; a second semiconductor region having the opposite conductivity type is disposed opposite to the emitter region with respect to the collector region. The thus obtained lateral transistor has a characteristic that a current flowing to the substrate is prevented under a saturation operation state and is suitably used to form, e.g., a current-mirror type constant-current circuit constituting a switching device having improved threshold characteristics.

1 Claim, 3 Drawing Sheets

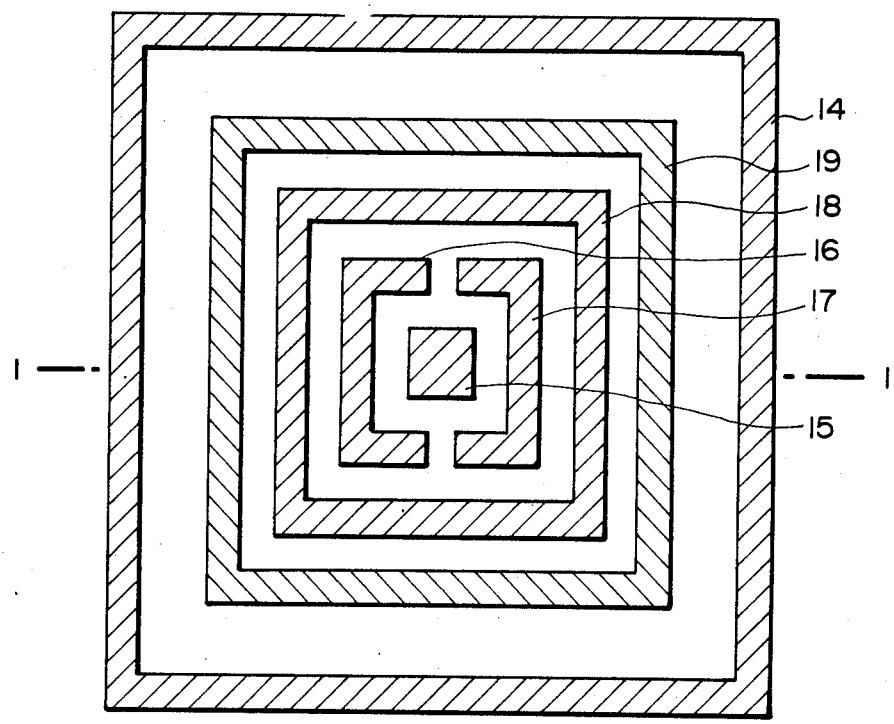
F I G. 1A
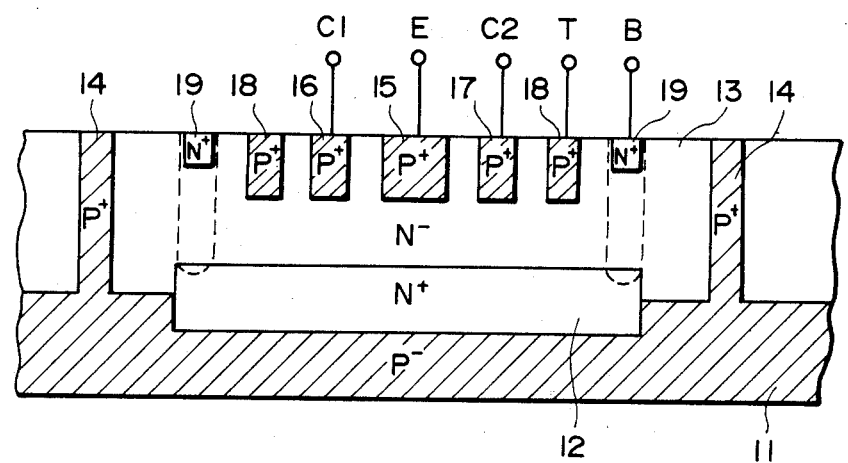
F I G. 1B

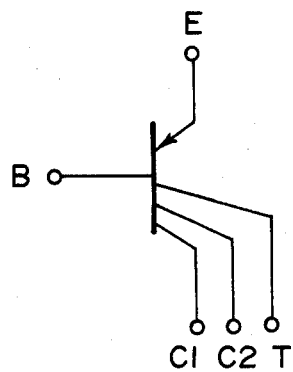
F I G. IC
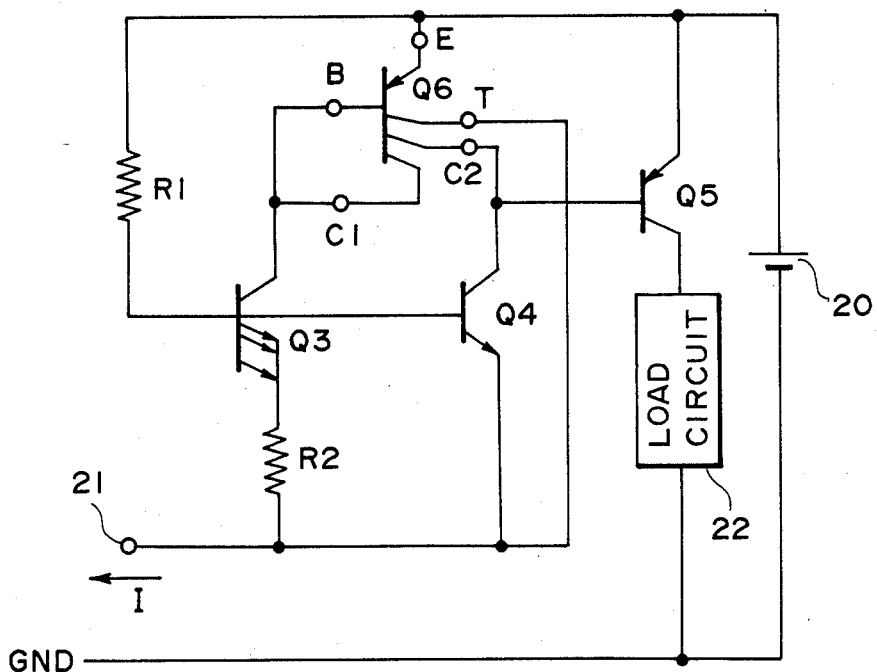
F I G. 2

LATERAL TRANSISTOR

This application is a continuation of application Ser. No. 047,519 filed May 6, 1987 which is a continuation of Ser. No. 827,152, filed Feb. 7, 1986, now both abandoned.

FIELD OF THE INVENTION AND RELATED ART

The present invention relates to a lateral transistor, particularly a lateral transistor which is intended to prevent a current from flowing into or out of a substrate.

FIG. 3 is a perspective view partly broken showing an example of conventional lateral transistor.

Referring to FIG. 3, on a P⁻-type substrate 1 is formed an N⁻ layer 2 in which are further formed a P-type emitter region 3, a P-type first collector region 4, a P-type second collector region 5, and an N⁺-type region 6 for making an ohmic contact with the base electrode. Surrounding these regions, a P-type cell isolation region 7 is formed.

In such a lateral transistor having a structure as described above, however, there occurs a phenomenon that when the collector-emitter voltage Vce is reduced to reach a saturation operation state, a current flowing out of the emitter region 3 is not captured by the collector region 4 or 5, but flows into the substrate 1 or the cell isolation region 7. Such a current flowing from the emitter region 7 into the substrate 1 does not contribute to the transistor operation in any way, but just leads to a result that a useless current flows from a power supply to the ground when such a transistor is used to constitute a circuit.

Such a problem is involved not only in a multi-collector-type lateral transistor but also in a single-collector-type one.

SUMMARY OF THE INVENTION

An object of the present invention is to solve the problems of the conventional lateral transistors as described above.

Another and more specific object of the present invention is to provide a lateral transistor wherein no current flows into the substrate or cell isolation region even when the collector-emitter voltage Vce is reduced to reach a saturation operation voltage.

According to the present invention, there is provided a lateral transistor, comprising: a first semiconductor region of one conductivity type, and an emitter region and a collector region both having a conductivity type opposite to that of said first semiconductor region and disposed in said first semiconductor region; wherein a second semiconductor region having a conductivity type opposite to that of said first semiconductor region is further disposed opposite to said emitter region with respect to said collector region.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1A is a schematic plan view of an embodiment of the lateral transistor according to the present invention, FIG. 1B is a sectional view taken along the line I—I in FIG. 1A, and FIG. 1C is an equivalent circuit diagram of the embodiment;

FIG. 2 is a circuit diagram showing an example of a switching device constituted by using a lateral transistor according to the above embodiment.

DETAILED DESCRIPTION OF PREFERRED EMBODIMENT

Figure 3:
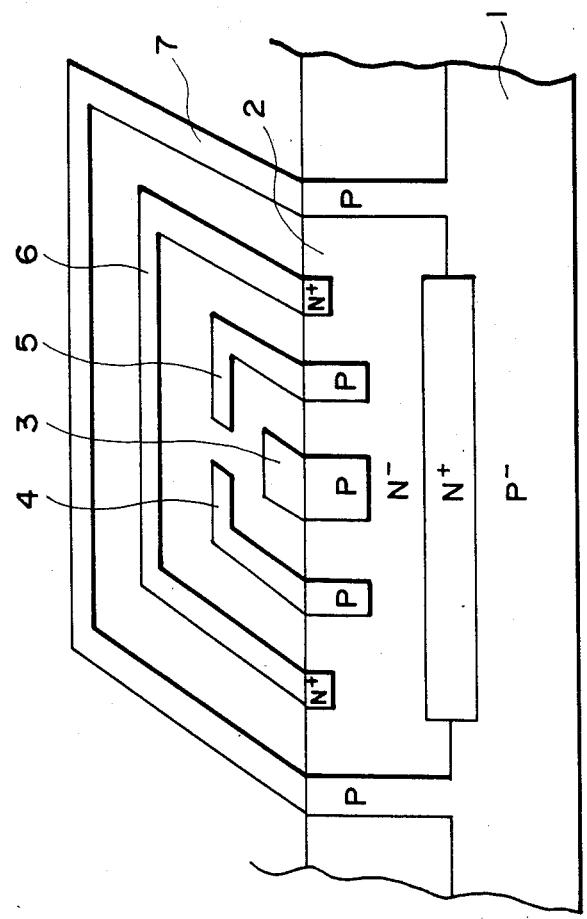
FIG. 3 is a partly broken perspective view of a conventional lateral transistor.

FIG. 1A is a schematic plan view of an embodiment of the lateral transistor according to the present invention, FIG. 1B is a sectional view taken along the line I—I in FIG. 1A, and FIG. 1C is an equivalent circuit of the embodiment.

Referring to these figures, an N⁺ buried layer 12 is formed on a P⁻ substrate 11, and an N⁻ layer 13 is further formed thereon by epitaxial growth. Then, a P region 14 as a cell isolation region is formed, e.g., by diffusion. Subsequently, a P⁺ emitter region 15, a P⁺ first collector region 16, a P⁺ second collector region, and a P⁺ region 18 surrounding the collector regions 16 and 17 are formed, and finally an N⁻ region 19 is formed so as to surround the P⁺ region 18. It is not always necessary that the N⁺ region 19 surrounds the P⁺ region 18, but the surrounding structure yields an advantage that a parasitic effect is reduced. Further, the N⁺ region 19 may also be formed deeply as shown by a dashed line in the figure.

In the FIGS. 1A and 1B, detailed structures of respective electrodes and insulating films are omitted from showing, and only the respective electrodes are briefly shown. Thus, an emitter electrode E is taken out from the emitter region 15; collector electrodes C1 and C2 from the collector regions 16 and 17; a base electrode B from the N⁺ region 19; and an electrode T from the P⁺ region.

In this construction, if a lower voltage is applied to the electrode T than that applied to the collector electrode C1 or C2, a current from the emitter region 15 flows to the P⁺ region 18 having a lower potential than the collector region 17 and not to the substrate 11, for example, when the voltage between the collector electrode C2 and the emitter electrode E to reach a saturation operation state of the transistor.

A circuit using a lateral transistor according to the present invention will now be explained.

FIG. 2 is a circuit diagram showing a switching device constituted by incorporating the above described embodiment.

With reference to FIG. 2, the above embodiment is shown as a lateral transistor Q6. The collector electrode C1 and the base electrode B is connected to each other to provide substantially or functionally two PNP transistors forming a current mirror-type constant-current circuit. The collectors C1 and C2 of the transistor Q6 are connected to the collector electrodes of NPN transistors Q3 and Q4, respectively. The transistors Q3 and Q4 have emitter areas in a ratio of n:1 (n>1). The base electrodes of the transistors Q3 and Q4 are commonly connected through a resistor R1 to the positive electrode of the power supply 20 so that the transistors Q3 and Q4 are biased to a constant level. It is sufficient that the resistor R1 has a high resistance, but a constant-current device such as an FET may also be used. The emitter electrode of the transistor Q3 is connected through a resistor R2 and the emitter electrode of the transistor Q4 is connected directly, respectively, to an input terminal 21. Further, the electrode T of the lateral transistor Q6 is also connected to the input terminal 21.

The collector electrode C2 of the transistor Q6 is connected to the base electrode of a PNP transistor Q5. The emitter electrode of the transistor Q5 is connected to the positive electrode of the power supply 20, and the collector electrode of the transistor Q5 is connected through a load circuit 22 to a grounding line GND. As the negative electrode of the power supply 20 is connected to the grounding line GND, the load circuit 22 is driven by an ON-OFF operation of the transistor Q5. Further, the emitter of the transistor Q6 is connected to the positive electrode of the power supply 20 and receives a current therefrom.

In the circuit arrangement as described above, the transistor Q5 is turned on or off depending on whether a current flowing at the input terminal exceeds a certain threshold $I_{th}$. The threshold $I_{th}$ is set by the ratio n of the emitter area of the transistor Q3 to that of the transistor Q4 and the resistor R2 connected to the emitter of the transistor Q3 as will be described hereinafter.

Next, the switching operation of the switching device as described above will be explained.

First, when the current I is smaller than the threshold $I_{th}$, a voltage difference at the resistor R2 is small, the transistor Q5 is placed in the OFF state and no operation for restricting the current I is effected. Further, as the emitter area of the transistor Q3 is larger than that of the transistor Q4, the collector current $I_{c3}$ of the transistor Q3 becomes larger than the collector current $I_{c4}$ of the transistor Q4 ($I_{c3} > I_{c4}$). As the lateral transistor 6 constitutes a current mirror type constant-current circuit, however, the path between the emitter electrode E and the collector electrode C2 of the transistor Q6 is placed in a state where a current equivalent to the collector current $I_{c3}$ of the transistor Q3 flows therethrough, whereby the potential of the collector electrode C2 rises to near the voltage of the power supply 20. As a result, the transistor Q5 retains its OFF state so that no current is supplied to the load circuit 22. At this time, the potential difference between the emitter electrode E and the collector C2 of the transistor Q6 has become small. As a result, when a conventional lateral transistor as explained with reference to FIG. 3 is used, an unnecessary current flows from the emitter region 3 to the substrate 1. In this embodiment, however, as the lateral transistor shown in FIGS. 1A–1C is used, such a current is captured by the P region 18 and flows to the input terminal 21 through the electrode T.

As the current I increases gradually, the current $I_{c3}$ also increases to result in an increased voltage drop at the resistor R2. Accordingly, the base-emitter voltage of the transistor Q4 increases preferentially to that of the transistor Q3. Nevertheless, unless the current I reaches the threshold $I_{th}$ determined by the emitter area ratio between the transistors Q3 and Q4, and the resistor R2, the condition of $I_{c3} > I_{c4}$ is retained so that the transistor Q5 remains in the "OFF" state.

Then, when the current I further increases to exceed the threshold $I_{th}$, a state of $I_{c3} < I_{c4}$ results with respect to the collector currents of the transistors Q3 and Q4. As the current condition of the collector C2 of the transistor Q6 is equivalent to $I_c$, however, the collector potential of the transistor Q4 is lowered so that the transistor Q5 is turned on and a current is supplied to the load circuit 22 from the power supply 20.

In this way, in the OFF state where no current is supplied to a load circuit, no current is allowed to flow from the power supply 20 to the ground. Further, the current I flowing at the input terminal can be made substantially equal to the current flowing to the transistor 06, whereby the waste of a current can be suppressed.

As fully described hereinabove, the lateral transistor according to the present invention may be constituted to prevent a useless current from flowing to the substrate even under a saturation operation state so that power consumption can be minimized.

What is claimed is:

1. A switching device, comprising:
   (1) a first transistor of the PNP structure comprising: a base region, an emitter region, a first collector region and a second collector region each having the same conductivity type as that of the emitter region, and a semiconductor region (A) disposed outside the first and second collector regions with respect to the emitter region and having the same conductivity type as that of the collector regions;
   (2) a second transistor of the NPN structure, the collector of the second transistor being connected to the base and the first collector of the first transistor;
   (3) a third transistor of the NPN structure having an emitter area 1/n times that of the second transistor, the collector of the third transistor being connected to the second collector of the first transistor;
   (4) a fourth transistor of the PNP structure, the base of the fourth transistor being connected to the second collector of the first transistor and the collector of the third transistor;
   load circuit means being connected to the collector of the fourth transistor;
   a power supply terminal being connected respectively to the emitter of the first transistor, to the bases of the second and third transistors respectively through a first resistor of a high resistance, and to the emitter of the fourth transistor;
   an input current terminal being connected respectively to the semiconductor region (A) of the first transistor, to the emitter of the second transistor through a second resistor, and to the emitter of the third transistor.

* * * * *